United States Patent [19]
Martin

[11] Patent Number: 6,036,528
[45] Date of Patent: Mar. 14, 2000

[54] HOLLOW CONTACT FOR SOLDER CONNECTION

[75] Inventor: Ralph Sykes Martin, Mount Airy, N.C.

[73] Assignee: The Whitaker Corporation, Wilmington, Del.

[21] Appl. No.: 09/012,295

[22] Filed: Jan. 23, 1998

[51] Int. Cl.⁷ ................................................ H01R 4/24
[52] U.S. Cl. .................. 439/425; 174/84 R; 174/261; 361/774
[58] Field of Search ................. 174/261, 84 R, 174/85; 439/426, 425, 391, 390, 851, 743; 361/774, 776, 778, 722

[56] References Cited

U.S. PATENT DOCUMENTS

| | | | |
|---|---|---|---|
| 2,689,337 | 9/1954 | Burtt et al. | 339/217 |
| 2,691,771 | 10/1954 | Burtt et al. | 339/217 |
| 3,363,171 | 1/1968 | Sietmann et al. | 324/556 |
| 3,964,816 | 6/1976 | Narozny | 439/397 |
| 4,017,142 | 4/1977 | Clark et al. | 439/870 |
| 4,662,699 | 5/1987 | Vachhani et al. | 439/395 |
| 4,720,270 | 1/1988 | Guenin et al. | 439/161 |
| 5,209,681 | 5/1993 | Brown | 439/876 |
| 5,660,565 | 8/1997 | Williams | 439/585 |

FOREIGN PATENT DOCUMENTS

| | | | |
|---|---|---|---|
| 2133227 | 7/1984 | United Kingdom | 439/425 |
| 2187049 | 8/1987 | United Kingdom | 439/425 |

*Primary Examiner*—Kristine Kincaid
*Assistant Examiner*—Dhiro R Patel
*Attorney, Agent, or Firm*—Robert Kapalka

[57] ABSTRACT

An electrical contact facilitates making a soldered connection between an insulated wire conductor and a circuit board. The contact includes a tubular contact body having a hollow interior. One end of the contact body has an insulation piercing edge which promotes penetration of the contact body through the insulation of the wire conductor and into the conductive core when the wire conductor is pressed against the edge of the contact body. The other end of the contact body is solderable to a circuit board. The hollow interior permits solder to be drawn by capillary action through the contact body and into the wire conductive core.

12 Claims, 1 Drawing Sheet

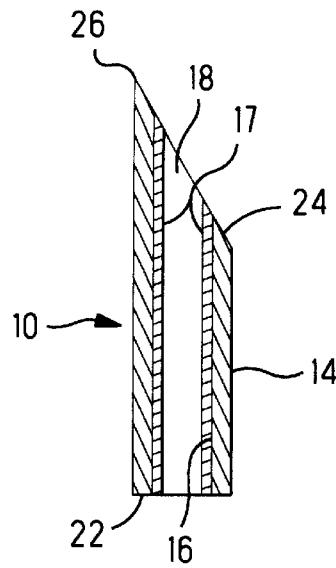
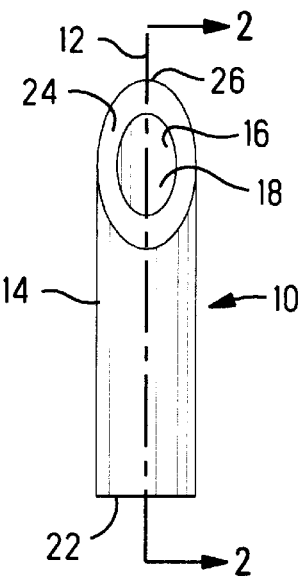
FIG. 2    FIG. 1
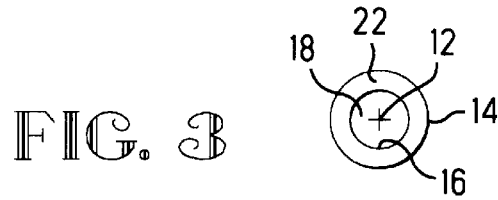
FIG. 3
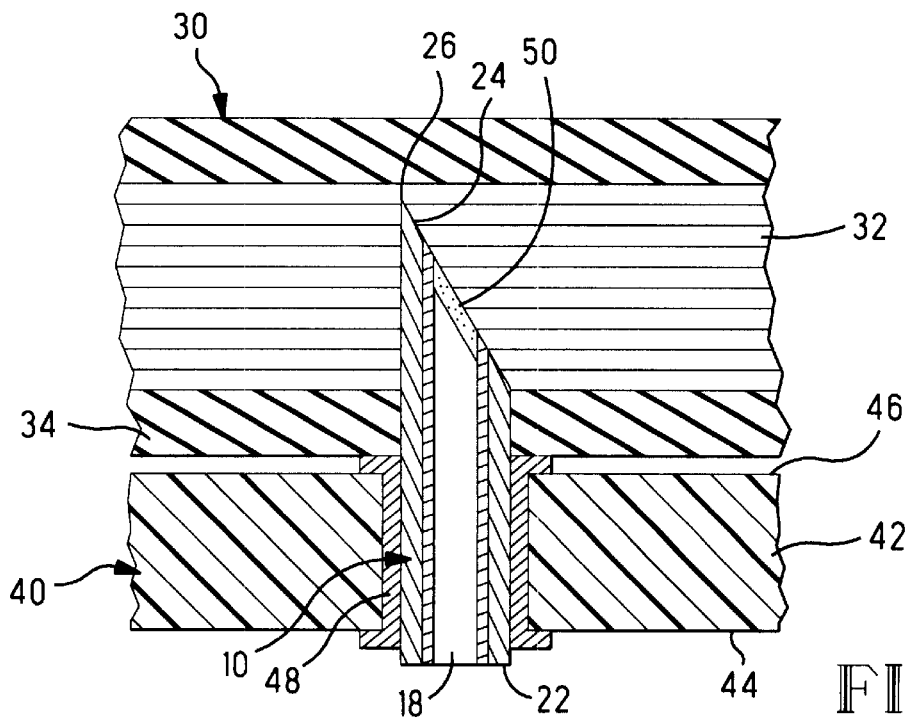
FIG. 4

HOLLOW CONTACT FOR SOLDER CONNECTION

FIELD OF THE INVENTION

The invention relates to an electrical contact which facilitates soldering of a wire to a circuit board.

BACKGROUND OF THE INVENTION

Wire conductors can be electrically connected to circuit traces on a circuit board by terminating the wire conductors in insulation displacement contacts which are mounted on the circuit board. In some applications it is desirable to solder the wire conductors directly to traces on the board. Soldered connections permit closer spacing of the wires on the board and are generally more reliable. However, in order to make soldered connections to wire conductors that are enclosed in a layer of insulation, the insulation must be stripped to expose the conductive wire core. Wire conductors used in the telecommunications industry are typically stranded wires that are surrounded by an insulation layer. A problem to be solved is how to connect these stranded wire conductors to a circuit board by soldering without having to strip the insulation from the wire conductors.

SUMMARY OF THE INVENTION

This problem is solved by an electrical contact according to the invention. The contact comprises a contact body having a hollow interior which opens through the contact body at spaced-apart ends of the contact body. One of the ends has an insulation piercing edge which promotes penetration of the one end through an insulative cover of a wire conductor and into the wire conductive core. The other end of the contact body is solderable to a circuit board. The hollow interior permits solder to be drawn by capillary action through the contact body and into the wire conductive core.

According to one aspect of the invention, the contact body extends along a rectilinear axis between the spaced-apart ends.

According to another aspect of the invention, an end face of the contact body resides in a plane that is oblique to the rectilinear axis.

According to yet another aspect of the invention, the contact body may include a solder preform disposed within the hollow interior.

According to still another aspect of the invention, an electrical connection comprises a circuit board and a tubular contact body in electrical engagement with the circuit board, the tubular contact body extending through an insulative cover of a wire conductor so that one end of the tubular contact body is disposed in a conductive core of the wire conductor, and the one end is connected by solder to the conductive core.

BRIEF DESCRIPTION OF THE DRAWINGS

The invention will now be described by way of example with reference to the accompanying drawings wherein:

FIG. 1 is a front view of a contact according to the invention;

FIG. 2 is a cross-sectional view of the contact taken along line 2—2 of FIG. 1;

FIG. 3 is a bottom view of the contact; and

FIG. 4 is a cross-sectional view showing the contact being used in a soldered electrical connection according to the invention.

DETAILED DESCRIPTION OF THE PREFERRED EMBODIMENT

With reference to FIGS. 1–3, an electrical contact according to the invention comprises an electrically conductive, tubular body 10 which extends along a central axis 12. In a preferred embodiment the axis 12 is rectilinear. The body has an outer surface 14, an inner surface 16, and a hollow interior 18. The body is shown as having a circular cross-sectional shape, although the body can be configured with a different cross-sectional shape such as elliptical. The diameter of the outer surface 14 is selected for a close fit within a through-hole in a circuit board as will be described below. The body has spaced-apart ends which define end faces 22, 24. The end face 22 resides in a plane that is generally perpendicular to the axis 12, and the end face 24 resides in a plane that is substantially oblique to the axis 12. The oblique end face 24 intersects the outer surface 14 of the body at an acute angle which provides an insulation piercing edge 26 that promotes penetration of the contact body through the insulation on a wire conductor when the wire conductor is pressed onto the end of the contact body.

FIG. 4 shows how the contact body 10 can be used to connect a wire conductor 30 to a circuit board 40. The circuit board 40 includes a dielectric substrate 42 having opposite major surfaces 44, 46. A through-hole in the substrate is plated with conductive material 48 that is connected to a conductive trace on the substrate. The contact body is installed in the through-hole and held in position so that the perpendicular end face 22 is disposed in the vicinity of the major surface 44 of the substrate. The contact body has a length between the end face 22 and the insulation piercing edge 26 which is selected according to the thickness of the circuit board 40 and the diameter of the wire conductor 30 so that the insulation piercing edge 26 is disposed at some height above the opposite major surface 46, which height is less than the diameter of the wire conductor 30. The wire conductor 30 having a conductive core 32 including strands of conductive wires that are surrounded by insulation 34 is pressed against the contact body so that the insulation piercing edge 26 penetrates the wire insulation 34 and the oblique end face 24 becomes embedded in the strands of the wire conductive core 32.

Solder is applied by any suitable manual or automated process to mechanically and electrically join the contact body to the wire conductive core 32 and to the circuit board. The solder will flow into the gap between the contact body and the plating of the through-hole. The solder will also be drawn by capillary action through the hollow interior 18 of the contact body and into the wire conductive core to form a solder joint 50 between the contact body and the conductive core.

Alternatively, the contact body can be manufactured to include a solder preform disposed within the hollow interior 18. The solder preform may be a solder coating 17 (FIG. 2) which is layered on the inner surface 16 of the contact body. A pre-plating material such as tin-lead may be applied to the exposed surfaces of the contact body prior to application of the solder coating in order to enhance adhesion of the solder coating to the surface of the contact body. The solder preform or solder coating 17 is reflowed by a suitable process which may include microwave heating in order to form solder connections between the conductive core 32 and the contact body, and between the circuit board plating 48 and the contact body.

The invention provides a simple electrical contact for connecting a wire conductor to a circuit board. The contact enables a solder connection to be made to an insulated wire without having to strip the insulation from the wire.

The invention having been disclosed, a number of variations will now become apparent to those skilled in the art. Whereas the invention is intended to encompass the foregoing preferred embodiments as well as a reasonable range of equivalents, reference should be made to the appended claims rather than the foregoing discussion of examples, in order to assess the scope of the invention in which exclusive rights are claimed.

We claim:

1. An electrical contact comprising:
   a contact body having a hollow interior which opens through the contact body at spaced-apart ends of the contact body, and one of the ends has an insulation piercing edge which promotes penetration of an insulative cover of a wire conductor,
   wherein a solder preform is disposed within the hollow interior of the contact body.

2. The electrical contact of claim 1 wherein the contact body extends along an axis between the spaced-apart ends.

3. The electrical contact of claim 2 wherein an end face of the contact body resides in a plane that is oblique to the axis.

4. The electrical contact of claim 3 wherein an opposite end face of the contact body resides in a plane that is perpendicular to the axis.

5. An electrical contact comprising:
   a tubular contact body having outer and inner surfaces which extend coaxially between spaced-apart ends of the tubular contact body, and one of the ends has an insulation piercing edge which promotes penetration of an insulative cover of a wire conductor,
   wherein a solder preform is disposed within the hollow interior of the contact body.

6. The electrical contact of claim 5 wherein the tubular contact body extends along an axis between the spaced-apart ends.

7. The electrical contact of claim 6 wherein an end face of the contact body resides in a plane that is oblique to the axis.

8. The electrical contact of claim 7 wherein an opposite end face of the contact body resides in a plane that is perpendicular to the axis.

9. An electrical connection comprising:
   a circuit board; and
   a tubular contact body in electrical engagement with the circuit board, the tubular contact body extending through an insulative cover of a wire conductor so that one end of the tubular contact body is disposed in a conductive core of the wire conductor, and the one end is connected by solder to the conductive core.

10. The electrical connection according to claim 9 wherein another end of the tubular contact body is connected by solder to the circuit board.

11. The electrical connection according to claim 10 wherein a layer of solder extends through an interior of the tubular contact body between the one end and the another end.

12. The electrical connection according to claim 9 wherein the tubular contact body extends along an axis, and an end face at the one end of the tubular contact body resides in a plane that is oblique to the axis.

* * * * *